United States Patent
Chen

(10) Patent No.: US 10,356,963 B2
(45) Date of Patent: Jul. 16, 2019

(54) ULTRATHIN LCD MODULE AND LIQUID CRYSTAL DISPLAY

(71) Applicant: Shenzhen China Star Optoelectronics Technology Co., Ltd., Shenzhen (CN)

(72) Inventor: Lixuan Chen, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/118,898

(22) PCT Filed: May 17, 2016

(86) PCT No.: PCT/CN2016/082282
§ 371 (c)(1),
(2) Date: Aug. 15, 2016

(87) PCT Pub. No.: WO2017/173701
PCT Pub. Date: Oct. 12, 2017

(65) Prior Publication Data
US 2017/0295678 A1    Oct. 12, 2017

(30) Foreign Application Priority Data
Apr. 8, 2016   (CN) .......................... 2016 1 0216511

(51) Int. Cl.
*H05K 7/20*    (2006.01)
*G09G 3/36*    (2006.01)
*G02F 1/1335*  (2006.01)

(52) U.S. Cl.
CPC .......... *H05K 7/20963* (2013.01); *G09G 3/36* (2013.01); *G02F 2001/133628* (2013.01)

(58) Field of Classification Search
None
See application file for complete search history.

(56) References Cited

U.S. PATENT DOCUMENTS

| 5,384,659 | A  | * | 1/1995 | Shikama | ................. G02B 3/04 348/E9.027 |
| 5,499,120 | A  | * | 3/1996 | Hansen  | ............. G02F 1/133603 349/62 |
| 6,011,605 | A  |   | 1/2000 | Mizuno et al. | |
| 6,204,900 | B1 | * | 3/2001 | Fergason | ............. G02F 1/1334 349/86 |
| 8,958,022 | B2 | * | 2/2015 | Youk    | .................... G02B 6/0083 349/161 |

(Continued)

FOREIGN PATENT DOCUMENTS

| CN | 1209619 | 3/1999 |
| CN | 1790126 | 6/2006 |

(Continued)

*Primary Examiner* — Xanthia C Cunningham

(57) ABSTRACT

An ultrathin LCD module and a liquid crystal display are provided. The ultrathin LCD module has a printed circuit board, a liquid crystal panel connected with the printed circuit board through at least one flexible circuit board, and an array light source of light emitting diodes disposed between the printed circuit board and the liquid crystal panel, which has a plurality of light emitting diodes and a substrate to carry the light emitting diodes. A projection of the flexible circuit board projected on the substrate is not overlapped with the light emitting diodes.

17 Claims, 4 Drawing Sheets

(56) References Cited

U.S. PATENT DOCUMENTS

| | | | | |
|---|---|---|---|---|
| 2003/0114566 A1* | 6/2003 | Hayashi | G02B 5/3033 | 524/386 |
| 2004/0135482 A1* | 7/2004 | Thielemans | G09F 9/33 | 313/22 |
| 2004/0150768 A1* | 8/2004 | Shimizu | G02F 1/134363 | 349/106 |
| 2005/0135115 A1* | 6/2005 | Lamb | G02B 6/0068 | 362/613 |
| 2006/0104090 A1* | 5/2006 | Lengyel | G02F 1/133603 | 362/612 |
| 2006/0268568 A1* | 11/2006 | Oku | B29D 11/00663 | 362/561 |
| 2006/0268574 A1* | 11/2006 | Jung | G02B 6/003 | 362/611 |
| 2007/0064444 A1* | 3/2007 | Kim | G02B 6/0031 | 362/612 |
| 2007/0153159 A1* | 7/2007 | Jung | G02B 6/0068 | 349/69 |
| 2007/0153548 A1* | 7/2007 | Hamada | G02B 6/0036 | 362/615 |
| 2007/0171623 A1* | 7/2007 | Zagar | B60K 35/00 | 362/23.12 |
| 2007/0210621 A1* | 9/2007 | Barton | B60Q 1/268 | 296/215 |
| 2009/0256987 A1* | 10/2009 | Jeon | G02B 6/0068 | 349/58 |
| 2010/0039579 A1* | 2/2010 | Park | G02F 1/133603 | 349/58 |
| 2010/0118227 A1* | 5/2010 | Shibata | G02B 3/005 | 349/58 |
| 2010/0188607 A1* | 7/2010 | Park | G02B 6/0073 | 349/62 |
| 2011/0102726 A1* | 5/2011 | Nobeoka | G02F 1/13306 | 349/150 |
| 2011/0110117 A1* | 5/2011 | Takai | G02B 1/105 | 362/629 |
| 2011/0122339 A1* | 5/2011 | Hamada | G02B 6/0085 | 349/62 |
| 2011/0273631 A1* | 11/2011 | Hayashi | G02B 6/0091 | 348/790 |
| 2011/0292315 A1* | 12/2011 | Bae | G02B 6/0088 | 349/58 |
| 2012/0026423 A1* | 2/2012 | He | G02B 6/0068 | 349/62 |
| 2012/0300486 A1* | 11/2012 | Matsushita | G02B 27/01 | 362/521 |
| 2013/0057806 A1* | 3/2013 | Kanemitsu | G02F 1/133603 | 349/64 |
| 2013/0063678 A1* | 3/2013 | Li | G02F 1/133615 | 349/58 |
| 2013/0088671 A1 | 4/2013 | Drzaic et al. | | |
| 2013/0100374 A1* | 4/2013 | Kang | G02B 6/0085 | 349/58 |
| 2013/0215360 A1* | 8/2013 | Pollack | G09G 3/3413 | 349/61 |
| 2013/0335676 A1* | 12/2013 | Tang | G02B 6/0031 | 349/65 |
| 2014/0003083 A1* | 1/2014 | Chowdhury | G02B 6/0085 | 362/559 |
| 2015/0167952 A1* | 6/2015 | Lee | F21V 29/70 | 362/612 |
| 2015/0212359 A1* | 7/2015 | Wada | G02F 1/133308 | 348/794 |
| 2015/0257312 A1* | 9/2015 | Tokuyama | H05K 7/20963 | 349/58 |
| 2015/0349028 A1* | 12/2015 | Lee | H01L 27/32 | 349/86 |
| 2015/0369990 A1* | 12/2015 | Wang | G02B 6/005 | 362/607 |
| 2016/0014880 A1* | 1/2016 | Lee | H05K 1/028 | 361/752 |

FOREIGN PATENT DOCUMENTS

| | | |
|---|---|---|
| CN | 1967320 | 5/2007 |
| CN | 202274376 | 6/2012 |
| CN | 103842898 | 6/2014 |

* cited by examiner

ULTRATHIN LCD MODULE AND LIQUID CRYSTAL DISPLAY

RELATED APPLICATIONS

This application is a National Phase of PCT Patent Application No. PCT/CN2016/082282 having International filing date of May 17, 2016 which claims the benefit of priority of Chinese Patent Application No. 201610216511.6 filed on Apr. 8, 2016. The contents of the above applications are all incorporated by reference as if fully set forth herein in their entirety.

FIELD OF THE INVENTION

The present invention relates to a technical field of liquid crystal displays, and more particularly to an ultrathin LCD module and a liquid crystal display.

BACKGROUND OF THE INVENTION

Liquid crystal display (LCD) devices have advantages of thin bodies, energy saving, and zero radiation, and therefore are widely applied. Most of the traditional liquid crystal display devices in the market are backlight type liquid crystal display devices, each of which includes a liquid crystal panel and a backlight module. The working principle of the liquid crystal panel is that: liquid crystal molecules are put between two parallel glass substrates, which have a plurality of perpendicular and horizontal thin wires therein, and the liquid crystal molecules are controlled to change their directions according to on or off electric currents, so that lights of the backlight module can pass through to create images. That is, because the liquid crystal panel itself cannot emit lights, it needs the lights provided by the backlight module to normally display the images. Therefore, the backlight module becomes one of the most important components of the liquid crystal display devices. According to difference incidence position of light sources, the backlight modules are divided into two types: an edge lighting backlight module and a bottom lighting backlight module. The bottom lighting backlight module is disposed light sources, such as a CCFL (cold cathode fluorescent lamp) or an LED (light emitting diode), under the liquid crystal panel, so as to directly form an area light source for the liquid crystal panel. The edge lighting backlight module disposes a light source, such as an LED light bar, under and beside the liquid crystal panel, so that lights of the LED light bar are emitted into a light guide plate from an incidence surface on an side surface thereof, and are emitted out from an emergent surface on a top surface thereof after being reflected and diffused, and then pass through an optical film set to form an area light source for the liquid crystal panel.

FIG. 1 is a schematic view of an LCD module of a traditional technology.

Refer now to FIG. 1, an LCD module comprises a printed circuit board 102; a liquid crystal panel 101 connected with the printed circuit board 102 through two flexible circuit boards 103; and an array light source of light emitting diodes disposed between the printed circuit board 102 and the liquid crystal panel 101, wherein the array light source of light emitting diodes comprises a plurality of light emitting diodes 104 and a substrate configured to carry the light emitting diodes 104. The light emitting diodes 104 are evenly arranged in a middle area between the liquid crystal panel 101 and the printed circuit board 102. Projections of the flexible circuit boards 103 on the substrate overlap with the light emitting diodes 104. Because the light emitting diodes 104 disperse heat when in operation, and more particularly the flexible circuit boards 103 are easily heated by the light emitting diodes 104 which are in the overlapping area, the performance of a liquid crystal display device is influenced.

SUMMARY OF THE INVENTION

The present invention is to provide an ultrathin LCD module, which can efficaciously solve a problem that: in traditional technologies, because light emitting diodes are evenly arranged, flexible circuit boards are heated.

For solving the above-mentioned problem, the present invention provides an ultrathin LCD module, which comprises:
a printed circuit board;
a liquid crystal panel connected with the printed circuit board through at least one flexible circuit board; and
an array light source of light emitting diodes disposed between the printed circuit board and the liquid crystal panel, which comprises a plurality of light emitting diodes and a substrate configured to carry the light emitting diodes; wherein bottoms of the light emitting diodes are provided with a heat sink;
wherein a projection of the flexible circuit board projected on the substrate is not overlapped with the light emitting diodes.

The heat sink is a metal bottom board.

Four sides of the liquid crystal panel are provided with four edge frames; a projection of the edge frames projected on the liquid crystal panel has four projection areas, including an upper projection area, a lower projection area, a left projection area, and a right projection area; wherein the upper projection area is parallel to and close to the printed circuit board; and the upper projection area is greater than the lower projection area.

The liquid crystal panel includes: an upper glass substrate, a lower glass substrate, and a liquid crystal positioned between the upper glass substrate and the lower glass substrate and mixed with a dichroic dye.

Gate drivers are integrated into the lower glass substrate.

The lower glass substrate has a light incidence surface, a lower surface, and a light emergent surface; and the light emitting diode has a light emitting surface facing the light incidence surface.

The lower surface is a dot pattern structure.

A reflection sheet is disposed under the lower surface.

The present invention further provides an ultrathin LCD module, which comprises:
a printed circuit board;
a liquid crystal panel connected with the printed circuit board through at least one flexible circuit board; and
an array light source of light emitting diodes disposed between the printed circuit board and the liquid crystal panel, which comprises a plurality of light emitting diodes and a substrate configured to carry the light emitting diodes; wherein a projection of the flexible circuit board projected on the substrate is not overlapped with the light emitting diodes.

A heat sink positioned under bottoms of the light emitting diodes.

The heat sink is a metal bottom board.

Four sides of the liquid crystal panel are provided with four edge frames; a projection of the edge frames projected on the liquid crystal panel has four projection areas, including an upper projection area, a lower projection area, a left projection area, and a right projection area; wherein the upper projection area is parallel to and close to the printed circuit board; and the upper projection area is greater than the lower projection area.

The liquid crystal panel includes: an upper glass substrate, a lower glass substrate, and a liquid crystal positioned between the upper glass substrate and the lower glass substrate and mixed with a dichroic dye.

Gate drivers are integrated into the lower glass substrate.

The lower glass substrate has a light incidence surface, a lower surface, and a light emergent surface; and the light emitting diode has a light emitting surface facing the light incidence surface.

The lower surface is a dot pattern structure.

A reflection sheet is disposed under the lower surface.

According to the above-mentioned objection of the present invention, a liquid crystal display is presented, and comprises an ultrathin LCD module, which comprises:

a printed circuit board;

a liquid crystal panel connected with the printed circuit board through at least one flexible circuit board; and an array light source of light emitting diodes disposed between the printed circuit board and the liquid crystal panel, which comprises a plurality of light emitting diodes and a substrate configured to carry the light emitting diodes; wherein a projection of the flexible circuit board projected on the substrate is not overlapped with the light emitting diodes.

Four sides of the liquid crystal panel are provided with four edge frames; a projection of the edge frames projected on the liquid crystal panel has four projection areas, including an upper projection area, a lower projection area, a left projection area, and a right projection area; wherein the upper projection area is parallel to and close to the printed circuit board; and the upper projection area is greater than the lower projection area.

The liquid crystal panel includes: an upper glass substrate, a lower glass substrate, and a liquid crystal positioned between the upper glass substrate and the lower glass substrate and mixed with a dichroic dye.

The ultrathin LCD module and the liquid crystal display according to the present invention are not like a traditional technology, in which light emitting diodes are evenly arranged between a liquid crystal panel and a printed circuit board, wherein projections of flexible circuit boards on a substrate overlap with the light emitting diodes, whereas in the present invention, light emitting diodes are evenly arranged between a liquid crystal panel and a printed circuit board, wherein since projections of flexible circuit boards projected on a substrate are not overlapped with the light emitting diodes, the flexible circuit boards can prevent an interruption from a heat dispersion of the light emitting diodes, and the performance of the liquid crystal display device cannot be influenced.

DESCRIPTION OF THE SPECIFIC EMBODIMENTS OF THE INVENTION

Figure 1:
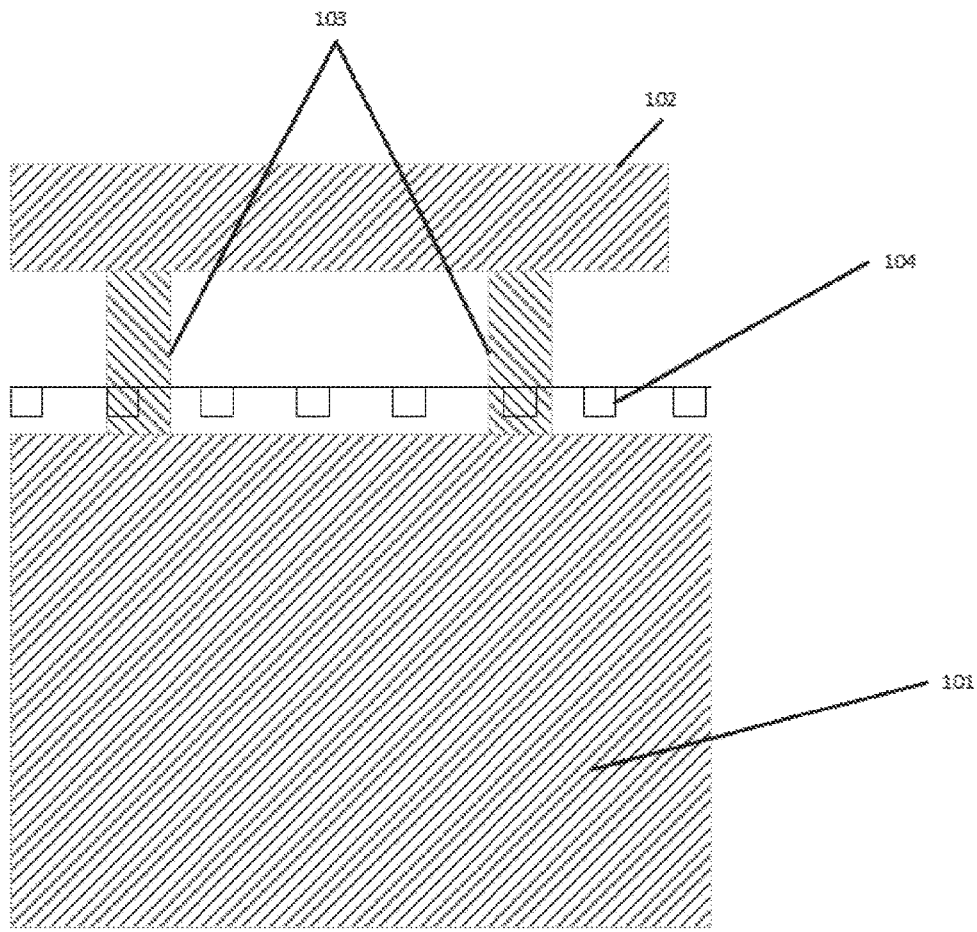
FIG. 1 is a schematic view of an LCD module of a traditional technology.

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inside, outer, side, etc., are only directions with reference to the accompanying drawings, so that the used directional terms are used to describe and understand the present invention, but the present invention is not limited thereto. In the drawings, units with similar structures use the same numerals.

In a traditional LCD module, light emitting diodes are evenly arranged between a liquid crystal panel and a printed circuit board, wherein projections of flexible circuit boards on a substrate overlap with the light emitting diodes, and because the light emitting diodes disperse heat when in operation, and more particularly the flexible circuit boards are easily heated by the light emitting diodes which are in the overlapping area, the performance of a liquid crystal display device is influenced. Thus, the present invention provides an ultrathin LCD module which can efficaciously conquer the above-mentioned defects.

Executive processes of embodiments of the present invention will be further described in detail below with reference to the drawings.

Figure 2:
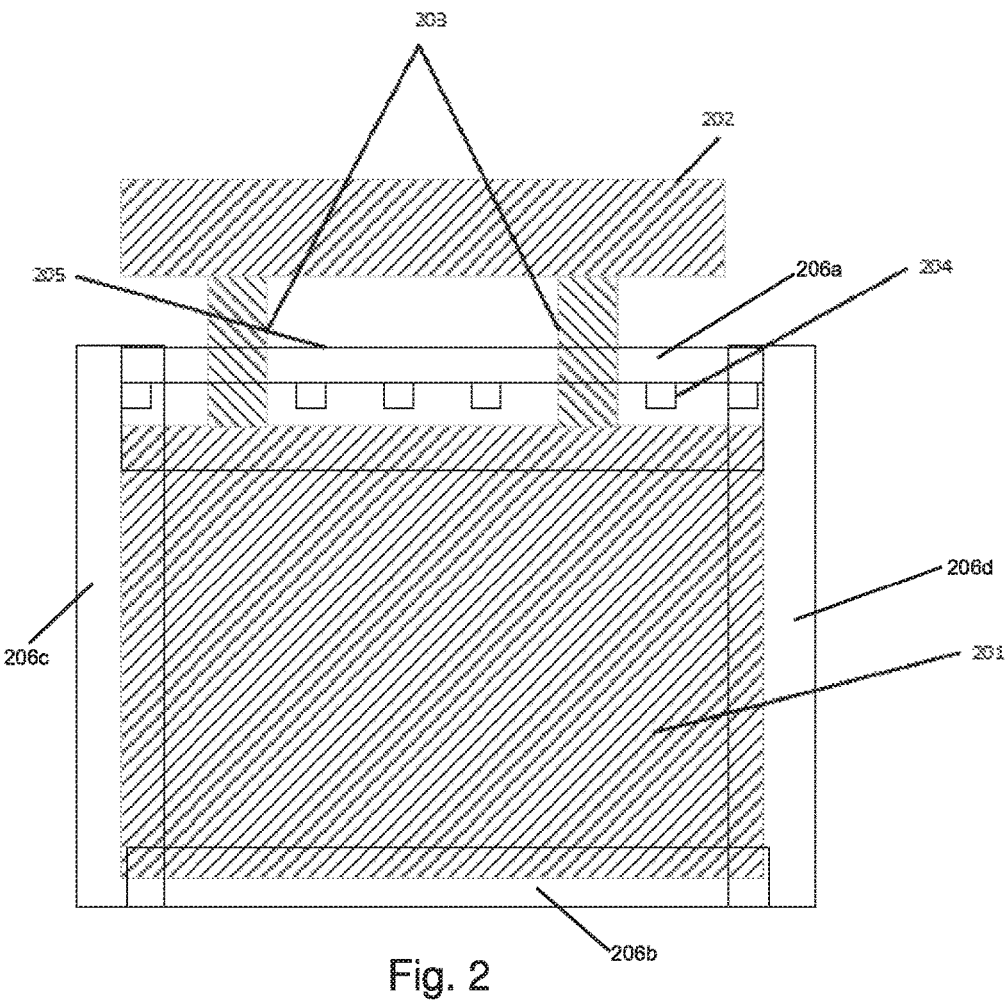
FIG. 2 is a schematic view of an ultrathin LCD module according to a first embodiment of the present invention.

Refer now to FIG. 2, which is a schematic view of an ultrathin LCD module according to a first embodiment of the present invention.

Figure 3:
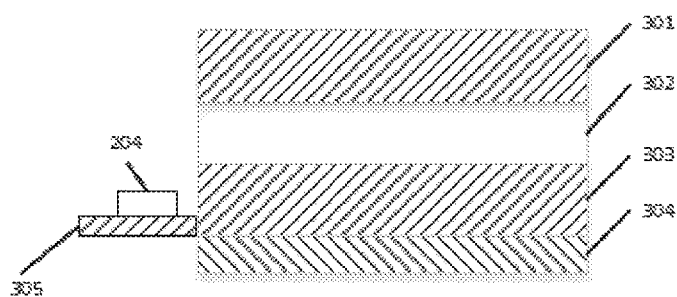
FIG. 3 is a schematic view of a liquid crystal panel structure and lights incidence according to the first embodiment of the present invention.

Refer now to FIG. 3, which is a schematic view of a liquid crystal panel structure and lights incidence thereof according to the first embodiment of the present invention.

The ultrathin LCD module of the embodiment comprises:

a printed circuit board 202;

a liquid crystal panel 201 connected with the printed circuit board 202 through two flexible circuit boards 203; and an array light source of light emitting diodes disposed between the printed circuit board 202 and the liquid crystal panel 201, wherein the array light source of light emitting diodes comprises a plurality of light emitting diodes 204 and a substrate configured to carry the light emitting diodes;

wherein projections of the flexible circuit boards 203 projected on the substrate are not overlapped with the light emitting diodes 204.

In the embodiment, the flexible circuit boards 203 are designed at two ends of one side of the liquid crystal panel 201 which is close to the array light source.

The ultrathin LCD module according to the present invention further comprises a heat sink 305, which is positioned under bottoms of the light emitting diodes 204. The heat sink 305 can be a metal bottom board.

In the embodiment, the substrate is been a strip-shape, and has a certain thickness, wherein the light emitting diodes 204 are arranged as a straight line on a surface of the substrate.

The substrate which carries the light emitting diodes 204 can be a metal core printed circuit board (MCPCB), and it not only can be an electric carrier for the light emitting diodes 204, but also be a heat transfer carrier for the light emitting diodes 204. The heat produced from the light emitting diodes 204 is transferred to the metal bottom board through the substrate.

The liquid crystal panel 201 includes: an upper glass substrate 301; a lower glass substrate 303; and a liquid crystal 302, which is positioned between the upper glass substrate 301 and the lower glass substrate 303, and is mixed with a dichroic dye.

In materials of liquid crystal, there is phenomenon called "guest-host effect", a dichroic dye being a "guest" body, which has anisotropy for absorption of visible light in the long axis direction and the short axis direction of a liquid crystal molecule, is melted into the liquid crystal 302 being a "host" body. If a positive dichroic dye is mixed into a transparent liquid crystal, because the positive dichroic dye can selectively absorb a light perpendicular to the long axis direction of the liquid crystal molecule, a natural light which is emitted into the liquid crystal mixed with the positive dichroic dye is transformed into a line polarization light; and if a negative dichroic dye is mixed into a transparent liquid crystal, because the negative dichroic dye can selectively absorb a light parallel to the long axis direction of the liquid crystal molecule, a natural light which is emitted into the liquid crystal mixed with the negative dichroic dye is transformed into a line polarization light. Therefore, by using the liquid crystal mixed with the dichroic dye to replace a polarization sheet, a natural light is transformed into a line polarization light, so that it can efficiently reduce the thickness of a liquid crystal module. Preferably, the dichroic dye of the embodiment can be 4-(p-phenyl benzoate)-1,8-naphthalimide(BENA), 4-{p[2'-(1'H-benzimidazole)]-phenyl}-1,8-naphthalimide(BIMZ), or 4-(p-[2-(5-phenyl-1,3,4-oxadiazole)]-phenyl)-1,8-naphthalimide (BODZ).

In the present invention, a GOA (gate driver on array) technology is adopted to integrate gate drivers into the lower glass substrate 303, so as to reduce a side edge of the ultrathin LCD module, namely to decrease a width of a side frame.

The lower glass substrate 303 has a light incidence surface, a lower surface, and a light emergent surface. The lower surface is a dot pattern structure. When a light is emitted on the dot pattern, the total reflection of the light is destroyed, and then the light becomes diffusion light to be emitted out to the lower glass substrate 303, so that it produces a condition to form an area light source. A reflection sheet 304 is disposed under the lower surface, and by the reflection sheet 304, light leak out to the bottom of the lower glass substrate 303 are reflected back, so as to increase the light utilization. The light emitting diode 204 has a light emitting surface, and the light emitting surface faces the light incidence surface.

The four sides of the liquid crystal panel 201 are provided with four edge frames 205. The edge frames 205 form four projection areas (an upper projection area 206a; a lower projection area 206b; a left projection area 206c; and a right projection area 206d) on a projection the liquid crystal panel 201, wherein the upper projection area 206a is parallel to and close to the printed circuit board, and the upper projection area 206a is greater than the lower projection area 206b. Because the light emitting diodes 204 are arranged bypass the flexible circuit boards 203, it can easily cause a light mixing problem. Preferably, in the present invention, since the upper projection area is greater than the lower projection area, the light mixing problem is solved.

In the ultrathin LCD module of the embodiment, by evenly arranging the plurality of light emitting diodes 204 between the liquid crystal panel and the printed circuit board, wherein since projection of the flexible circuit board projected on the substrate are not overlapped with the light emitting diodes, the flexible circuit boards can prevent an interruption from the heat dispersion of the light emitting diodes, and the performance of the liquid crystal display device cannot be influenced.

Figure 4:
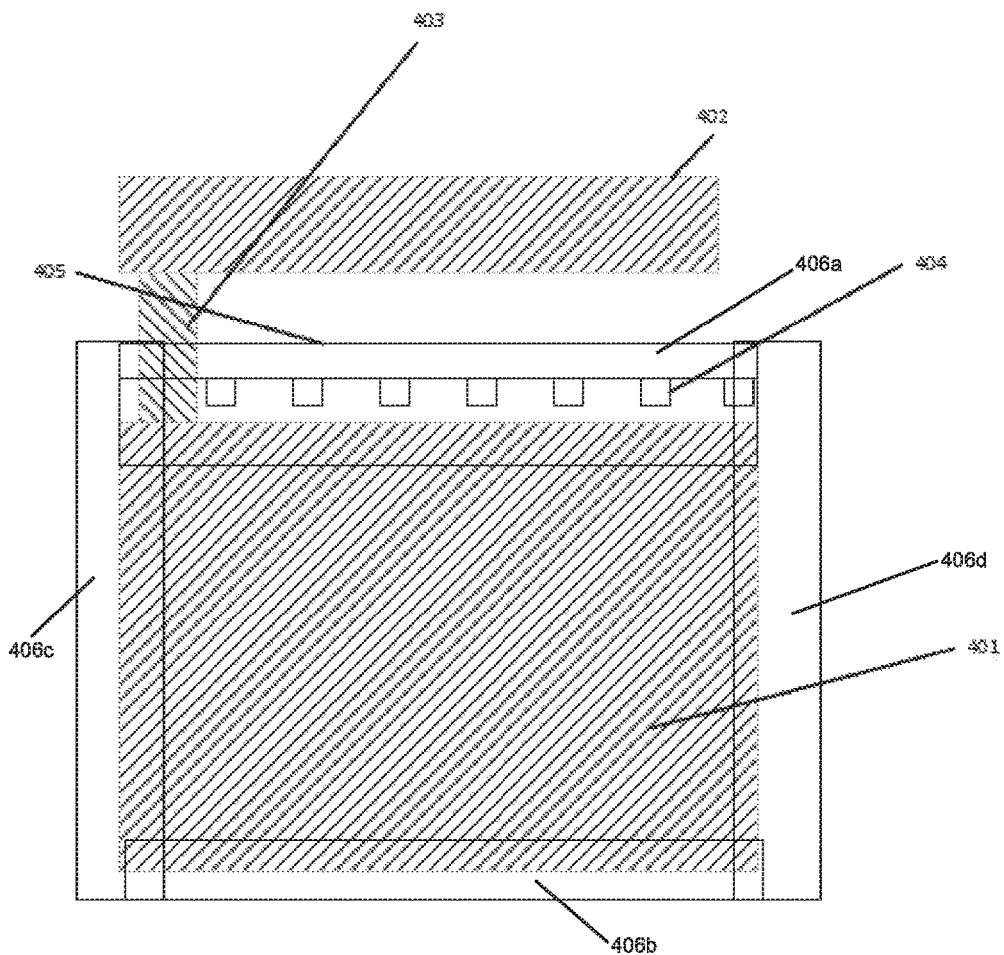
FIG. 4 is a schematic view of an ultrathin LCD module according to a second embodiment of the present invention.

Refer now to FIG. 4, which is a schematic view of an ultrathin LCD module according to a second embodiment of the present invention.

Figure 5:
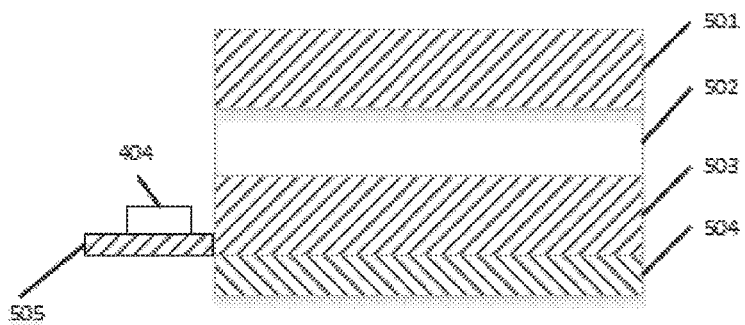
FIG. 5 is a schematic view of a liquid crystal panel structure and lights incidence according to the second embodiment of the present invention.

Refer now to FIG. 5, which is a schematic view of a liquid crystal panel structure and lights incidence thereof according to the second embodiment of the present invention.

The difference between the second embodiment and the first embodiment of the ultrathin LCD module is that: a liquid crystal panel 401 connected with a printed circuit board 402 through one flexible circuit board 403, so that the length of the light source is increased in one side thereof, so as to improve the backlight effect of entire of the LCD model.

The ultrathin LCD module of the embodiment comprises:
a printed circuit board 402;
a liquid crystal panel 401 connected with the printed circuit board 402 through one flexible circuit board 403; and
an array light source of light emitting diodes disposed between the printed circuit board 402 and the liquid crystal panel 401, wherein the array light source of light emitting diodes comprises a plurality of light emitting diodes 404 and a substrate configured to carry the light emitting diodes;
wherein projection of the flexible circuit board 403 projected on the substrate is not overlap with the light emitting diodes 404.

In the embodiment, the flexible circuit boards 403 are designed at two ends of one side of the liquid crystal panel 401 which is close to the array light source.

The ultrathin LCD module according to the present invention further comprises a heat sink 505, which is positioned under bottoms of the light emitting diodes 404. The heat sink 505 can be a metal bottom board.

In the embodiment, the substrate is been a strip-shape, and has a certain thickness, wherein the light emitting diodes 404 are arranged as a straight line on a surface of the substrate.

The substrate which carries the light emitting diodes 404 can be a metal core printed circuit board (MCPCB), and it not only can be an electric carrier for the light emitting diodes 404, but also be a heat transfer carrier for the light emitting diodes 404. The heat produced from the light emitting diodes 404 is transferred to the metal bottom board through the substrate.

The liquid crystal panel 401 includes: an upper glass substrate 501; a lower glass substrate 503; and a liquid crystal 502, which is positioned between the upper glass substrate 501 and the lower glass substrate 503, and is mixed with a dichroic dye.

In materials of liquid crystal, there is phenomenon called "guest-host effect", a dichroic dye being a "guest" body, which has anisotropy for absorption of visible light in the long axis direction and the short axis direction of a liquid crystal molecule, is melted into the liquid crystal 502 being a "host" body. If a positive dichroic dye is mixed into a transparent liquid crystal, because the positive dichroic dye can selectively absorb a light perpendicular to the long axis direction of the liquid crystal molecule, a natural light which is emitted into the liquid crystal mixed with the positive dichroic dye is transformed into a line polarization light; and if a negative dichroic dye is mixed into a transparent liquid crystal, because the negative dichroic dye can selectively absorb a light parallel to the long axis direction of the liquid crystal molecule, a natural light which is emitted into the liquid crystal mixed with the negative dichroic dye is transformed into a line polarization light. Therefore, by using the liquid crystal mixed with the dichroic dye to replace a polarization sheet, a natural light is transformed into a line polarization light, so that it can efficiently reduce the thickness of a liquid crystal module. Preferably, the dichroic dye of the embodiment can be 4-(p-phenyl benzoate)-1,8-naphthalimide(BENA), 4-{p[2'-(1'H-benzimidazole)]-phenyl}-1,8-naphthalimide(BIMZ), or 4-(p-[2-(5-phenyl-1,3,4-oxadiazole)]-phenyl)-1,8-naphthalimide (BODZ).

In the present invention, a GOA (gate driver on array) technology is adopted to integrate gate drivers into the lower glass substrate 503, so as to reduce a side edge of the ultrathin LCD module, namely to decrease a width of a side frame.

The lower glass substrate 503 has a light incidence surface, a lower surface, and a light emergent surface. The lower surface is a dot pattern structure. When a light is emitted on the dot pattern, the total reflection of the light is destroyed, and then the light becomes diffusion light to be emitted out to the lower glass substrate 503, so that it produces a condition to form an area light source. A reflection sheet 504 is disposed under the lower surface, and by the reflection sheet 504, light leak out to the bottom of the lower glass substrate 503 are reflected back, so as to increase the light utilization. The light emitting diode 404 has a light emitting surface, and the light emitting surface faces the light incidence surface.

The four sides of the liquid crystal panel 401 are provided with four edge frames 405. The edge frames 405 form four projection areas (an upper projection area 406a; a lower projection area 406b; a left projection area 406c; and a right projection area 406d) on a projection the liquid crystal panel 401, wherein the upper projection area 406a is parallel to and close to the printed circuit board, and the upper projection area 406a is greater than the lower projection area 406b. Because the light emitting diodes 404 are arranged bypass the flexible circuit boards 403, it can easily cause a light mixing problem. Preferably, in the present invention, since the upper projection area is greater than the lower projection area, so that the light mixing problem is solved.

Based on the first embodiment, the liquid crystal panel 401 is connected with the printed circuit board 402 by one of the flexible circuit boards 403, so that this embodiment also can prevent an interruption from the heat dispersion of the light emitting diodes, and the performance of the liquid crystal display device cannot be influenced.

Figure 6:
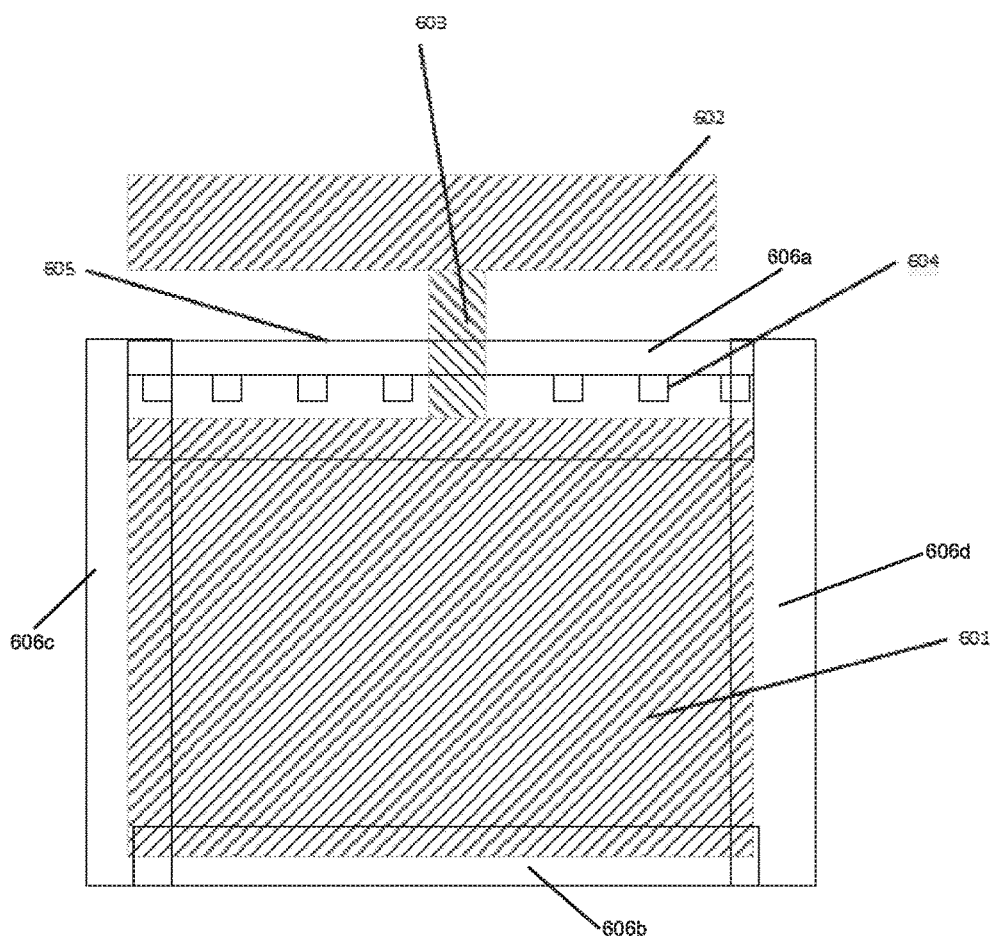
FIG. 6 is a schematic view of an ultrathin LCD module according to a third embodiment of the present invention.

Refer now to FIG. 6, which is a schematic view of an ultrathin LCD module according to a third embodiment of the present invention.

Figure 7:
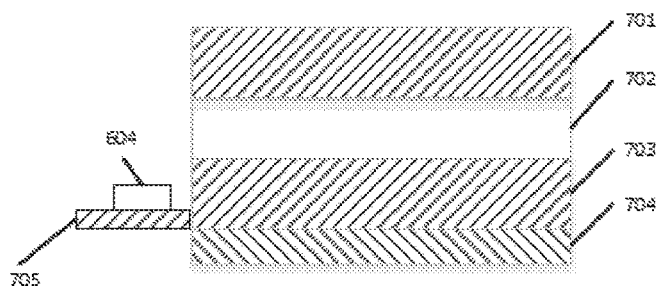
FIG. 7 is a schematic view of a liquid crystal panel structure and lights incidence according to the third embodiment of the present invention.

Refer now to FIG. 7, which is a schematic view of a liquid crystal panel structure and lights incidence thereof according to the third embodiment of the present invention.

The difference between the third embodiment and the second embodiment of the ultrathin LCD module is that: one flexible circuit boards 603 is designed at middle of one side of the liquid crystal panel 601 which is close to the array light source, so as to improve the backlight effect of entire of the LCD model.

The ultrathin LCD module of the embodiment comprises:
a printed circuit board 602;
a liquid crystal panel 601 connected with the printed circuit board 602 through one flexible circuit board 603; and
an array light source of light emitting diodes disposed between the printed circuit board 602 and the liquid crystal panel 601, wherein the array light source of light emitting diodes comprises a plurality of light emitting diodes 604 and a substrate configured to carry the light emitting diodes;
wherein projection of the flexible circuit board 603 projected on the substrate is not overlapped with the light emitting diodes 604.

In the embodiment, the flexible circuit boards 603 are designed at two ends of one side of the liquid crystal panel 601 which is close to the array light source.

The ultrathin LCD module according to the present invention further comprises a heat sink 705, which is positioned under bottoms of the light emitting diodes 604. The heat sink 705 can be a metal bottom board.

In the embodiment, the substrate is been a strip-shape, and has a certain thickness, wherein the light emitting diodes 604 are arranged as a straight line on a surface of the substrate.

The substrate which carries the light emitting diodes 604 can be a metal core printed circuit board (MCPCB), and it not only can be an electric carrier for the light emitting diodes 604, but also be a heat transfer carrier for the light emitting diodes 604. The heat produced from the light emitting diodes 604 is transferred to the metal bottom board through the substrate.

The liquid crystal panel 601 includes: an upper glass substrate 701; a lower glass substrate 703; and a liquid crystal 702, which is positioned between the upper glass substrate 701 and the lower glass substrate 703, and is mixed with a dichroic dye.

In materials of liquid crystal, there is phenomenon called "guest-host effect", a dichroic dye being a "guest" body, which has anisotropy for absorption of visible light in the long axis direction and the short axis direction of a liquid crystal molecule, is melted into the liquid crystal 702 being a "host" body. If a positive dichroic dye is mixed into a transparent liquid crystal, because the positive dichroic dye can selectively absorb a light perpendicular to the long axis direction of the liquid crystal molecule, a natural light which is emitted into the liquid crystal mixed with the positive dichroic dye is transformed into a line polarization light; and if a negative dichroic dye is mixed into a transparent liquid crystal, because the negative dichroic dye can selectively absorb a light parallel to the long axis direction of the liquid crystal molecule, a natural light which is emitted into the liquid crystal mixed with the negative dichroic dye is transformed into a line polarization light. Therefore, by using the liquid crystal mixed with the dichroic dye to replace a polarization sheet, a natural light is transformed into a line polarization light, so that it can efficiently reduce the thickness of a liquid crystal module. Preferably, the dichroic dye of the embodiment can be 4-(p-phenyl benzoate)-1,8-naphthalimide(BENA), 4-{p[2'-(1'H-benzimidazole)]-phenyl}-1,8-naphthalimide(BIMZ), or 4-(p-[2-(5-phenyl-1,3,4-oxadiazole)]-phenyl)-1,8-naphthalimide (BODZ).

In the present invention, a GOA (gate driver on array) technology is adopted to integrate gate drivers into the lower glass substrate 703, so as to reduce a side edge of the ultrathin LCD module, namely to decrease a width of a side frame.

The lower glass substrate 703 has a light incidence surface, a lower surface, and a light emergent surface. The lower surface is a dot pattern structure. When a light is emitted on the dot pattern, the total reflection of the light is destroyed, and then the light becomes diffusion light to be emitted out to the lower glass substrate 703, so that it produces a condition to form an area light source. A reflection sheet 704 is disposed under the lower surface, and by the reflection sheet 704, light leak out to the bottom of the lower glass substrate 703 are reflected back, so as to increase the light utilization. The light emitting diode 604 has a light emitting surface, and the light emitting surface faces the light incidence surface.

The four sides of the liquid crystal panel 601 are provided with four edge frames 605. The edge frames 605 form four projection areas (an upper projection area 606a; a lower projection area 606b; a left projection area 606c; and a right projection area 606d) on a projection the liquid crystal panel 601, wherein the upper projection area 606a is parallel to and close to the printed circuit board, and the upper projection area 606a is greater than the lower projection area 606b. Because the light emitting diodes 604 are arranged bypass the flexible circuit boards 603, it can easily cause a light mixing problem. Preferably, in the present invention, since the upper projection area is greater than the lower projection area, so that the light mixing problem is solved.

Based on the second embodiment, the flexible circuit boards 603 is designed at middle of one side of the liquid crystal panel 601 which is close to the array light source, so that this embodiment also can prevent an interruption from the heat dispersion of the light emitting diodes, and the performance of the liquid crystal display device cannot be influenced.

The present invention has been described with preferred embodiments thereof and it is understood that many changes and modifications to the described embodiment can be carried out without departing from the scope and the spirit of the invention that is intended to be limited only by the appended claims.

What is claimed is:

1. An ultrathin LCD module, comprising:
   a printed circuit board;
   a liquid crystal panel connected with the printed circuit board through at least one flexible circuit board, wherein the printed circuit board is positioned beside one of four sides of the liquid crystal panel; and
   an array light source of light emitting diodes disposed between the printed circuit board and the liquid crystal panel, which comprises a plurality of light emitting diodes and a substrate configured to carry the light emitting diodes, wherein the plurality of light emitting diodes are disposed between the printed circuit board and the liquid crystal panel; wherein a heat sink is disposed under the light emitting diodes;
   wherein a projection of the flexible circuit board projected on the substrate is not overlapped with the light emitting diodes; and
   wherein the four sides of the liquid crystal panel are provided with four edge frames; a projection of the edge frames projected on the liquid crystal panel from top to down has four projection areas, including an upper projection area, a lower projection area, a left projection area, and a right projection area; wherein the upper projection area is parallel to and close to the printed circuit board; and the upper projection area is greater than the lower projection area.

2. The ultrathin LCD module according to claim 1, wherein the heat sink is a metal bottom board.

3. The ultrathin LCD module according to claim 1, wherein the liquid crystal panel includes: an upper glass substrate, a lower glass substrate, and a liquid crystal positioned between the upper glass substrate and the lower glass substrate and mixed with a dichroic dye.

4. The ultrathin LCD module according to claim 3, wherein gate drivers are integrated into the lower glass substrate.

5. The ultrathin LCD module according to claim 3, wherein the lower glass substrate has a light incidence surface, a lower surface, and a light emergent surface; and the light emitting diode has a light emitting surface facing the light incidence surface.

6. The ultrathin LCD module according to claim 5, wherein the lower surface is a dot pattern structure.

7. The ultrathin LCD module according to claim 5, wherein a reflection sheet is disposed under the lower surface.

8. An ultrathin LCD module, comprising:
   a printed circuit board;
   a liquid crystal panel connected with the printed circuit board through at least one flexible circuit board, wherein the printed circuit board is positioned beside one of four sides of the liquid crystal panel; and
   an array light source of light emitting diodes disposed between the printed circuit board and the liquid crystal panel, which comprises a plurality of light emitting diodes and a substrate configured to carry the light emitting diodes, wherein the plurality of light emitting diodes are disposed between the printed circuit board and the liquid crystal panel;
   wherein a projection of the flexible circuit board projected on the substrate is not overlapped with the light emitting diodes; and
   wherein the four sides of the liquid crystal panel are provided with four edge frames; a projection of the edge frames projected on the liquid crystal panel from top to down has four projection areas, including an upper projection area, a lower projection area, a left projection area, and a right projection area; wherein the upper projection area is parallel to and close to the printed circuit board; and the upper projection area is greater than the lower projection area.

9. The ultrathin LCD module according to claim 8, further comprising a heat sink positioned under the light emitting diodes.

10. The ultrathin LCD module according to claim 9, wherein the heat sink is a metal bottom board.

11. The ultrathin LCD module according to claim 8, wherein the liquid crystal panel includes: an upper glass substrate, a lower glass substrate, and a liquid crystal positioned between the upper glass substrate and the lower glass substrate and mixed with a dichroic dye.

12. The ultrathin LCD module according to claim 11, wherein gate drivers are integrated into the lower glass substrate.

13. The ultrathin LCD module according to claim 11, wherein the lower glass substrate has a light incidence surface, a lower surface, and a light emergent surface; and the light emitting diode has a light emitting surface facing the light incidence surface.

14. The ultrathin LCD module according to claim 13, wherein the lower surface is a dot pattern structure.

15. The ultrathin LCD module according to claim 13, wherein a reflection sheet is disposed under the lower surface.

16. A liquid crystal display, comprising an ultrathin LCD module which comprises:
- a printed circuit board;
- a liquid crystal panel connected with the printed circuit board through at least one flexible circuit board, wherein the printed circuit board is positioned beside one of four sides of the liquid crystal panel; and
- an array light source of light emitting diodes disposed between the printed circuit board and the liquid crystal panel, which comprises a plurality of light emitting diodes and a substrate configured to carry the light emitting diodes, wherein the plurality of light emitting diodes are disposed between the printed circuit board and the liquid crystal panel;
- wherein a projection of the flexible circuit board projected on the substrate is not overlapped with the light emitting diodes; and
- wherein the four sides of the liquid crystal panel are provided with four edge frames; a projection of the edge frames projected on the liquid crystal panel from top to down has four projection areas, including an upper projection area, a lower projection area, a left projection area, and a right projection area; wherein the upper projection area is parallel to and close to the printed circuit board; and the upper projection area is greater than the lower projection area.

17. The liquid crystal display according to claim 16, wherein the liquid crystal panel includes: an upper glass substrate, a lower glass substrate, and a liquid crystal positioned between the upper glass substrate and the lower glass substrate and mixed with a dichroic dye.

\* \* \* \* \*